(12) United States Patent
Takagi et al.

(10) Patent No.: US 7,399,575 B2
(45) Date of Patent: Jul. 15, 2008

(54) LAMINATED PHOTOSENSITIVE RELIEF PRINTING ORIGINAL PLATE AND METHOD FOR PRODUCING THE RELIEF PRINTING PLATE

(75) Inventors: Toshiya Takagi, Kanagawa (JP); Takashi Fujimoto, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 49 days.

(21) Appl. No.: 10/564,978

(22) PCT Filed: Sep. 1, 2004

(86) PCT No.: PCT/JP2004/013003

§ 371 (c)(1),
(2), (4) Date: Jan. 18, 2006

(87) PCT Pub. No.: WO2005/026836

PCT Pub. Date: Mar. 24, 2005

(65) Prior Publication Data

US 2006/0177771 A1    Aug. 10, 2006

(30) Foreign Application Priority Data

Sep. 12, 2003    (JP) ............................. 2003-322052

(51) Int. Cl.
*G03F 7/00* (2006.01)
*G03F 7/26* (2006.01)
*G03C 5/18* (2006.01)
*G03C 5/26* (2006.01)
*G03C 1/725* (2006.01)

(52) U.S. Cl. ................ 430/302; 430/270.1; 430/281.1; 430/284.1; 430/286.1; 430/288.1; 430/306; 430/309; 430/434; 430/494

(58) Field of Classification Search .............. 430/270.1, 430/281.1, 284.1, 286.1, 288.1, 302, 306, 430/309, 434, 494
See application file for complete search history.

(56) References Cited

U.S. PATENT DOCUMENTS

| 4,555,471 | A  | * | 11/1985 | Barzynski et al. ......... 430/273.1 |
| 5,506,086 | A  | * | 4/1996  | Van Zoeren ................. 430/201 |
| 5,759,742 | A  |   | 6/1998  | West et al. |
| 5,994,026 | A  |   | 11/1999 | DeBoer et al. |
| 6,410,208 | B1 | * | 6/2002  | Teng ........................... 430/302 |
| 6,451,505 | B1 | * | 9/2002  | Patel et al. ................ 430/273.1 |
| 7,029,805 | B2 | * | 4/2006  | Ray et al. ....................... 430/5 |
| 7,049,047 | B2 | * | 5/2006  | Tenaglia et al. .......... 430/273.1 |
| 2003/0022107 | A1 |   | 1/2003 | Yang et al. |

FOREIGN PATENT DOCUMENTS

| EP | 0 366 503 A2 | 5/1990 |
| EP | 0 738 930 A2 | 10/1996 |
| JP | 09-166875 | 6/1997 |
| JP | 2773981 | 4/1998 |
| JP | 2916408 | 4/1999 |
| JP | 11-153865 | 6/1999 |
| JP | 2001-324815 | 11/2001 |
| JP | 2003-035954 | 2/2003 |
| JP | 2003-035955 | 2/2003 |

* cited by examiner

*Primary Examiner*—Geraldina Visconti
(74) *Attorney, Agent, or Firm*—Wenderoth, Lind & Ponack, L.L.P.

(57) ABSTRACT

A relief printing original plate including a substrate, a photosensitive resin layer thereon that is photosensitive to ultraviolet radiations, and a mask layer thereon having both ultraviolet and non-ultraviolet absorbability, the ultraviolet absorbability being deactivatable in response to receiving non-ultraviolet radiation. A method for producing a relief printing plate by using the original plate is also provided.

9 Claims, No Drawings

LAMINATED PHOTOSENSITIVE RELIEF PRINTING ORIGINAL PLATE AND METHOD FOR PRODUCING THE RELIEF PRINTING PLATE

TECHNICAL FIELD

The present invention relates to a laminated photosensitive relief printing original plate for producing a relief printing plate such as a flexographic printing plate, and a method of producing the relief printing plate.

BACKGROUND ART

As well known, flexography is relief printing in which a flexible printing plate is used. The flexography has been reappraised and attracting attention because of its higher printing accuracy, better economic efficiency, versatility, and environmental friendliness.

In Japan, relatively common printing systems are the offset printing and the gravure printing. Other printing systems that are less common than them may include the silk-screen printing. The relief printing such as the flexography is relatively not so common in Japan, although flexography has some advantages such as the following:

(1) The plate used in the flexography has a relief and the plate is flexible which allows printing on objects that are not flat and smooth like the corrugated cartons. In addition, the flexography is faster and cheaper than other printing systems.

(2) The flexography allows printing on smaller objects, such as labels, sharply and cheaply.

(3) Compared with the offset printing, the flexography produces a clearer print because of the possibility of use of a highly concentrated ink.

(4) Compared with the gravure printing, the flexography produces sharper characters and images.

(5) As an aqueous ink and a completely solvent-free ink such as an UV ink can be used, the flexography is environment friendly.

(6) The flexography takes lesser time to attain a stable color condition, and therefore, a futility of print media, such as paper, can be cut down which makes the flexography more economical.

(7) The flexography needs lesser maintenance cost or modification cost because only a part of the plate can be replaced without the need to replace the whole plate.

(8) The flexography can be used in many varieties of small lot production.

Such a variety of advantages are well known since the relief printing is a conventional old printing technique, and so has been the flexography as a sort of the relief printing. Nevertheless, the flexography was not so common among all of the printing industry.

However, recently, there has been an improvement in the quality of printing ink and printing materials, and a rise of concern about environmental problems so that the relief printing such as flexography is being re-evaluated. Therefore, research and development of the flexography has been intensifying at present.

The state of art as to the printing original plate is as follows:

The flexographic printing plate has been made of a rubber layer as a constituent material, on which a negative image of characters and pictures to be printed are carved. However, recently, a photosensitive resin is being used to make the flexographic printing plate (see, for example, Japanese Patent Publication No. 2916408 and Japanese Patent Application Laid-open No. 2003-35954). In general, this photosensitive resin includes an elastomeric binder, at least one monomer resin, and a photoinitiator. The flexographic printing original plate made with the photosensitive resin is a material in a form of a plate including a substrate and at least a photosensitive resin layer provided thereon.

Production of the flexographic printing plate by using such a printing original plate may be carried out in accordance with the following procedure. A film (mask) that has a negative pattern corresponding to images to be printed, such as characters or pictures, is placed on the photosensitive resin layer of the printing original plate. The photosensitive resin layer is then irradiated with an actinic radiation through this mask. The part of the layer irradiated with the actinic radiation is cured by photopolymerization. Subsequent washout of the uncured part with a developer liquid results in development of a relief pattern corresponding to the images, to give a flexographic printing plate. Upon performing flexography, ink is applied to the top surface of the relief pattern and the flexographic printing plate is pressed on a printing media such as paper, to obtain a print product.

It has been pointed out that the flexographic printing plate made of the photosensitive resin has following problems that are desired to be solved:

(i) When the negative pattern on the mask has to be corrected, whole of the mask has to be re-made since it is impossible to partially correct the mask. Therefore, the correction requires a large number of steps.

(ii) As the negative mask is made of a negative film, the shape of the mask tends to be fluctuated due to changes in the temperature and the humidity. Therefore, even if the same mask is used, accuracy of the printing may change depending on the time and environment for performing pattern formation steps including exposure and development of the photosensitive resin layer.

(iii) Optical obstacles such as dust enter easily between the negative mask and the photosensitive resin layer during the pattern forming process. Such optical obstacles between the mask and the photosensitive resin layer may cause inaccuracy of the pattern image after exposure and development, which may lead to deterioration of the printing quality of the printing plate.

As a countermeasure to these problems, there have hitherto been developed several kinds of printing plates each having a new construction (see, for example, Japanese Patent Publication No. 2916408, Japanese Patent Application Laid-open No. 2003-35954, Japanese Patent Application Laid-open No. 2003-35955, Japanese Patent Application Laid-open No. H11-153865, Japanese Patent Application Laid-open No. H9-166875, Japanese Patent Application Laid-open No. 2001-324815, and Japanese Patent Publication No. 2773981). A common feature of these printing original plates is that an infrared-sensitive layer is at least formed on the photosensitive resin layer. The infrared-sensitive layer may be used as a negative mask or a positive mask. This infrared sensitive layer is opaque to actinic radiations that polymerize the photosensitive resin in the photosensitive resin layer, but has a photosensitivity to infrared radiations. The infrared-sensitivity is the ability to be vaporized and/or decomposed, i.e. ablated, by the exposure to the infrared laser radiations. Therefore, the infrared-sensitive layer is also referred to as an infrared ablation layer.

Lamination of such an infrared ablation layer enables direct recording of the image information to be printed with an infrared laser on the relief printing original plate such as the flexographic printing original plate, and thus obviates the need of the conventional negative or positive mask film. The print image information corresponding to the print pattern can be formed, saved, corrected, and output as a digital information using a computer. The infrared ablation layer thus drastically reduces the cost for image information processing which is necessary when the conventional mask film is used for producing the relief printing plate.

Various kinds of compositions are known for the infrared ablation layer, however, the basic composition is similar. For instance, Japanese Patent Publication No. 2916408 discloses a printing original plate having an infrared ablation layer made of (1) at least one infrared absorbing material, (2) an opaque material to non-infrared radiations (ultraviolet radiations), wherein the infrared absorbing material and the opaque material may be the same or different, and (3) at least one binder that is substantially incompatible with low molecular materials in the photosensitive resin layer.

Any material that prevents the transmission of non-infrared actinic radiations to the photosensitive resin layer may be used as the opaque material. Examples of suitable opaque materials include dyes that absorb ultraviolet or visible light, dark inorganic pigments and combination thereof. Preferred opaque materials are carbon black and graphite.

The infrared absorbing material has a strong absorption in the region from 750 to 20,000 nm. Examples of suitable infrared absorbing materials include dark inorganic pigments such as carbon black, graphite, copper chromite, chromium oxides, and chromium-cobalt aluminate; and dyes such as poly(substituted)phthalocyanine compounds, cyanine dyes, squarylium dyes, chalcogenopyryloarylidene dyes.

With the conventional relief printing original plate, the mask layer that is opaque to the ultraviolet actinic radiation is selectively ablated (burned out) for forming an area of the mask through which the ultraviolet actinic radiation can pass. In the step of ablation of the mask layer for obtaining the mask image layer, it is thus necessary to provide a vacuuming and exhausting means for taking ablation debris out of the reaction system in order to prevent the ablation debris from remaining on or attaching to the surface of the photosensitive resin.

If even a thin layer of the mask material remains in the area of the mask image layer through which the actinic radiation has to pass, the amount of the actinic radiation that pass through the mask will be decreased. Therefore, the ablation of the mask layer must be performed until the photosensitive resin layer is revealed. Such an ablation process results in roughening of the revealed surface of the photosensitive resin layer by the infrared laser. Since such roughening on revealed portion remains in the subsequent development step to be the surface on which ink for printing will be put, it may cause damage on the quality of the printing.

DISCLOSURE OF THE INVENTION

The present invention is accomplished in view of the aforementioned circumstances in the prior art. It is an object of the present invention to provide a relief printing original plate capable of forming a mask image layer with high contrast but without roughening the surface of the photosensitive resin layer therebeneath, as well as a method for producing a relief printing plate by using the relief printing original plate.

In order to solve the aforementioned problem, a relief printing original plate according to the present invention includes a substrate; a photosensitive layer that is laminated on said substrate and that is photosensitive to ultraviolet radiations; and a mask layer that is laminated on the photosensitive layer, said mask layer having an ability to absorb both an ultraviolet radiation and a non-ultraviolet radiation, the ultraviolet absorbability of said mask layer being deactivatable in response to receiving said non-ultraviolet radiation.

A method for producing a relief printing plate according to the present invention includes the step of irradiating a patterned light with an actinic radiation on a photosensitive resin layer of a printing original plate, said printing original plate has been produced by forming a photosensitive resin layer on a substrate; and the step of developing the plate with the developing liquid whereby forming a resin layer having a relief pattern for printing on said substrate to obtain said printing plate for the relief printing; wherein a photosensitive laminate is provided as said relief printing original plate, said laminate having a substrate and at least a photosensitive resin layer having an ultraviolet sensitivity and a mask layer laminated thereon, and said mask layer having an ability to absorb both an ultraviolet radiation and a non-ultraviolet radiation, wherein the ultraviolet absorbability of said mask layer is deactivatable in response to receiving said non-ultraviolet radiation; and wherein said method further comprises: the step of irradiating said mask layer with said non-ultraviolet irradiation in accordance with an image pattern for printing, whereby said mask layer is converted Into a mask image layer having an irradiated area being transparent to said ultraviolet radiation; the step of irradiating said photosensitive resin layer with said ultraviolet radiation through said mask image layer as a mask; and removing said photosensitive resin layer in an unirradiated area that has not been irradiated with said ultraviolet radiation and has thus been uncured, with said developing liquid.

In the present invention having the aforementioned features, the non-ultraviolet radiation may be an infrared radiation (infrared laser light) or a part of visible light. The visible light that may be employed is not the visible light in any of the all wavelength region but a part of the visible light having an wavelength near infrared region. Preferable light may include Ar laser light and the ½ YAG laser light.

According to the aforementioned features, upon irradiating the mask layer with a non-ultraviolet radiation such as an infrared radiation in accordance with the image to be printed, the ultraviolet absorbability of the irradiated area of the mask layer will be deactivated and the area will thus be transparent to the ultraviolet radiation. The mask image layer can thus be formed without ablation of the mask material. That is, the mask image layer can be formed without additional equipment and steps for treating the ablation debris.

If the ultraviolet-transparent area is formed with ablation by the infrared irradiation in a range of the non-ultraviolet region, the transparency of the infrared-irradiated area to the ultraviolet radiation can be ensured by incomplete burn out of the mask layer keeping a certain thickness of the mask material at the bottom the area for protecting the surface of the photosensitive resin layer therebeneath, since the mask material at the bottom has already lost its ultraviolet absorbability by the infrared irradiation for ablation. The advantages of such a co-use of the removal of the infrared (non-ultraviolet)-irradiated area by such ablation together with the deactivation of the ultraviolet absorbability in the region by an acid will be as follows: Firstly, majority of the infrared-irradiated region can be an air space that has an excellent ultraviolet transparency. Secondly, the surface of the photosensitive resin layer can be advantageously protected by the remaining un-ablated film of the mask layer at the bottom of the area. Further, the mask film at the bottom has become transparent to the ultraviolet radiation and very thin, thus the transparency thereof to the ultraviolet radiation is further improved. Therefore, by such a co-use of the ablation by the infrared (non-ultraviolet) irradiation together with the deactivation of the ultraviolet absorbability, the ultraviolet transparency of the infrared (non-ultraviolet)-irradiated area can further be improved compared to the ultraviolet transparency of the irradiated area obtained only by the deactivation of the ultraviolet absorbability by the infrared irradiation, as well as a mask image layer having high contrast can be formed without roughening the surface of the photosensitive resin layer therebeneath.

These and other objects, features and advantages of the present invention are specifically set forth in or will become apparent from the following detailed descriptions of the invention.

BEST MODE FOR CARRYING OUT THE INVENTION

As mentioned above, the present invention is characterized by the employment of, as a relief printing original plate, a photosensitive laminate having at least a photosensitive resin layer that is ultraviolet-sensitive, and a mask layer having both ultraviolet absorbability and non-ultraviolet absorbability, the ultraviolet absorbability of which is deactivatable in response to receiving the non-ultraviolet radiation such as an infrared or Ar radiation.

In such a construction, the deactivation of the mask layer's ultraviolet absorbability by the non-ultraviolet irradiation such as the infrared or Ar irradiation may be carried out without ablation of the mask layer by suitably selecting the energy amount of the non-ultraviolet irradiation such as the infrared or Ar irradiation in a predetermined range.

Alternatively, the infrared irradiation as the non-ultraviolet irradiation may be carried out at the greater energy amount than the aforementioned range so that the deactivation of the mask layer's ultraviolet absorbability by the infrared irradiation may be performed along with ablation of the mask layer.

It is preferable that the mask layer has an oxygen permeability coefficient in the range from $1 \times 10^{-17}$ to $9 \times 10^{-10}$. Such a certain amount of oxygen permeation through the mask layer may inhibit the exposure to light and development of the photosensitive resin layer in a degree, which lead to a somehow tapered pattern profile with a smaller surface area of the pattern top on which an ink is applied, resulting in a sharp image of the resulting print product.

It is preferable that the mask layer contains a binder resin, an acid generator, and an ultraviolet absorber whose ability to absorb the non-infrared radiations is deactivatable in response to contact with an acid.

In the following, each element of the relief printing original plate according to the present invention will be described in more detail with reference to the examples of a flexographic printing original plate and a letterpress printing original plate.

(Substrate Layer)

The substrate layer of the flexographic printing original plate and the letterpress printing original plate of the present invention may be any substrate having sufficient physical properties such as a mechanical strength that are required in printing. Examples of the materials thereof may include a publicly known metal, a plastic films, paper and composites thereof. The materials may specifically include polymeric films made of a polymer produced by, e.g., addition polymerization and linear condensation polymerization, transparent foams and fabrics, nonwoven fabrics such as a glass-fiber fabrics, and metals such as steel, iron, aluminum, zinc, copper, brass and stainless-steel. It is preferred that the substrate is transparent to non-infrared radiations so that exposure from backside becomes possible. More preferable examples of the substrate may include plates and films of polyethylene terephthalate (PET), nylon, polyethylene, polypropylene, acrylic resin and polyesters. The polyethylene terephthalate film is particularly preferable for use in flexography. The thickness of the film may be in a range of 50 to 300 μm, preferably 75 to 200 μm. The surface of the substrate facing the photosensitive resin layer may be coated with a thin layer of an adhesion improving layer. Preferable examples of the adhesion improving layer for flexographic printing original plate may include a mixture of polycarbonate, phenoxy resin, and polyisocyanate. Preferable examples of the adhesion improving layer for the letterpress printing original plate may include those described in Japanese Patent Application Laid-open. No. S61-17148, that is, those containing a polyester resin, a polyurethane resin, an epoxy resin, an acrylic ester resin, or an ethylene-vinyl acetate resin as a major ingredient, and those containing a polyvinyl alcohol resin or a cellulose resin as a major ingredient.

(Photosensitive Resin Layer)

The photosensitive resin layer for the flexographic printing original plate of the present invention may consist of an elastomeric binder and a photosensitive resin composition containing one or more sorts of monomer and a polymerization initiator that is sensitive to the non-infrared radiation. Any photosensitive resin compositions that are suitable for an ordinary flexography may be employed. The elastomeric binder may be composed of a homopolymer, copolymer, or mixture of thereof, and has elastomeric property. The elastomeric binder may be soluble, swellable, or dispersible in an aqueous or organic solvent so that the elastomeric binder is removable by washing. Examples of resins for the elastomeric binder may include polybutadiene, polyisoprene, polydiolefins, copolymers or a block copolymers of an aromatic vinyl compound and a diolefin, styrene/butadiene copolymers, styrene/isoprene copolymers, diolefin/acrylonitrile copolymers, ethylene/propylene copolymers, ethylene/propylene/diolefin copolymers, ethylene/acrylic acid copolymers, diolefin/acrylic acid copolymers, diolefin/acrylic acid ester/acrylic acid copolymers, ethylene/(meth)acrylic acid/(meth)acrylic acid ester copolymers, polyamides, polyvinyl alcohols, graft copolymers of a polyvinyl alcohol and a polyethylene glycol, amphoteric interpolymers, cellulose derivatives such as alkyl celluloses, hydroxyalkyl celluloses and nitrocelluloses, ethylene/vinyl acetate copolymers, cellulose acetate butyrates, polybutyrals, cyclized rubbers, styrene/acrylic acid copolymers, polyvinyl pyrrolidones and polyvinyl pyrrolidone/vinyl acetate copolymers. These polymers may be used either singly or as a blend of two kinds or more. The examples of the binder may also include binder resins that are soluble or dispersible in an aqueous developer solution that are disclosed in U.S. Pat. Nos. 3,458,311, 4,442,302, 4,361,640, 3,794,494, 4,177,074, 4,431,723, and 4,517,279, as well as binder resins that are soluble, swellable or dispersible in an organic developer solvent that are disclosed in U.S. Pat. Nos. 4,323,636, 4,430,417, and 4,045,231.

It is necessary that one or more monomers to be contained in the photosensitive resin layer for the present flexographic printing original plate is compatible with the aforementioned binder in order to form a clear photosensitive resin layer without cloudiness. Examples of the monomers may be the monomers that constitute the aforementioned binders, and the monomers that are disclosed in U.S. Pat. Nos. 4,323,636, 4,753,865, 4,726,877, and 4,894,315.

The photosensitive resin layer for the letterpress printing original plate may contain an elastomeric binder and a photosensitive resin composition containing one or more sorts of monomers and a polymerization initiator that is sensitive to a non-infrared radiation. Any photosensitive resin compositions that are suitable for an ordinary letterpress printing may be employed.

Examples of the elastomeric binder may include a partially saponified polyvinyl acetate resin and the derivatives thereof, copolymers of acrylic acid ester and maleic acid, an alkyd resin, polyethylene oxide, a water-soluble or alcohol-soluble polyamide resin, an ethylene-vinyl acetate copolymer, a polystyrene resin, a phenol resin, a polyester resin, an epoxy resin, and a polyvinyl butyral resin, such as those described in Japanese Patent Application Laid-open Nos. H4-240644, S61-17148, S62-187848, S63-8735, S63-10150, H1-274132, H1-287671, H2-39048, H2-73810 and H4-240855 as well as Japanese Patent Publication No. S53-2082. Particularly preferable are copolymers made of monomers that are partially or completely saponified vinyl alcohol and another monomer selected from (meth)acrylic acid, (meth)acrylamide, N-methylol (meth)acrylamide, styrene, propylene, maleic anhydride, (meth)acrylonitrile, and (meth)acrylic acid ester; etherified product made by the reaction of any of the aforementioned copolymers with a lower alkylol (meth)acrylamide such as methylol (meth)acrylamide and ethylol (meth) acrylamide; a water-soluble polyamide made by polymerization of diamines such as N,N'-bis(aminomethyl)-piperazine and N,N'-bis(β-aminoethyl)-piperazine, dicarboxylic acids such as N,N'-bis(carboxymethyl)-piperazine and N,N'-bis(carboxymethyl)-methylpiperazine, and lower alkyl esters or acid haloganates thereof, and ω-amino acids such as N-(aminoethyl)-N'-(carboxymethyl)-piperazine; and polyamide resins having a sulfonate group or a base group.

The monomer to be contained in the photosensitive resin layer for the present letterpress printing original plate may be one or more of those having at least one photopolymerizable alkenyl group such as (meth)acrylic acid, (meth)acrylic acid ester, (meth)acrylamide, (meth)acrylonitrile, styrene glycidyl(meth)acrylate, allyl(meth)acrylate, trimethylolpropane tri(meth)acrylate, allyl compounds, vinyl ether compounds and vinyl ester compounds. Preferable examples thereof may include a condensate of urea, thiourea, or a lower alkyl, lower alkylol or lower alkyl-lower alkylol derivative thereof, condensed with a lower alkylol (meth)acrylamide; and a polyethylene glycol diester obtained by the reaction of the hydroxyl groups thereof with (meth)acrylic acid.

The amount of the monomer may preferably be in the range of 5 to 30 parts by weight, and more preferably 10 to 20 parts by weight per 100 parts by weight of the binder of the photosensitive resin layer. When the content of the monomer is lower than the aforementioned range, the resulting layer after non-infrared irradiation and curing may unpreferably have low anti-wearness and chemical resistance. When the content is higher than the aforementioned range, the resulting photosensitive resin layer may have low elastomeric property, thus being unpreferable as a flexographic printing plate.

Examples of the polymerization initiator may include aromatic ketones such as benzophenone; benzoin ethers such as benzoin methyl ether, benzoin ethyl ether, benzoin isopropyl ether, α-methylolbenzoin methyl ether, α-methoxybenzoin methyl ether, 2,2-diethoxyphenyl acetophenone methoxyphenyl acetophenone (2,2-dimethoxy-1,2-diphenylethane-1-one), and 2-benzyl-2-dimethylamino-1-(4-morpholinophenyl)-butanone-1; substituted or non-substituted multicyclic quinones; and polymerization initiators disclosed in U.S. Pat. Nos. 4,460,675, and 4,894,315. The polymerization initiator may be used either singly or as a combination of two kinds or more.

It is preferable that the amount of the polymerization initiator in the photosensitive resin layer is in the range of 0.001% to 10% of the total weight of the photosensitive resin layer.

The photosensitive resin composition for forming the photosensitive resin layer may optionally contain additives such as sensitizers, thermal polymerization inhibitors, plasticizers, and coloring agents, depending on the properties required therefor. There are various methods for preparing the photosensitive resin compound. For example, the ingredients to be contained may be dissolved in a suitable solvent such as chloroform, tetrachloroethylene, methyl ethyl ketone and toluene to form a solution, and that solution may be poured into a mold followed by evaporation of the solvent to thereby form a plate. Alternatively, the ingredients may be kneaded without any solvent in a kneader or on a roll mill, and the mixture may be shaped into the form of a plate of desirable thickness by using a suitable molding machine such as an extruder, an injection molding machine, or a molding press.

(Mask Layer)

It is preferable that the mask layer for use in the present invention includes the binder resin, the acid generator, and the ultraviolet absorber that is deactivatable in response to the contact with the acid. For efficient functioning of the acid generator, the mask layer may further contain the photothermal conversion agent that converts light energy into the thermal energy, and a sensitizer.

The binder is not particularly limited as long as it has a film forming capability and is substantially transparent to the ultraviolet radiations. It is preferable that the binder resin is incompatible or substantially incompatible with the photosensitive resin layer. In particular, binder resins that contain a hydroxyl or carboxyl group are preferable. Examples of such binder resins may include polyvinyl butyrals, polyvinyl acetals, epoxy resins, cellulose derivatives, polyalkylene oxide derivatives, polyurethane derivatives, and terpene resins.

Examples of the cellulose derivative may include methyl cellulose, ethyl cellulose, hydroxyl cellulose, hydroxypropyl cellulose, cellulose acetate, cellulose acetylpropionate, cellulose acetylbutyrate, and nitrocellulose.

Examples of the polyalkylene oxide derivatives may include the compounds represented by the following formulae (1) to (8):

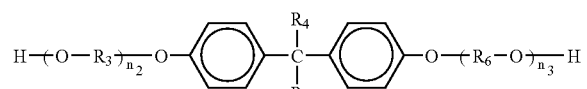

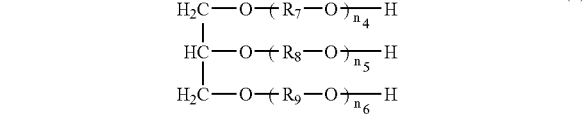

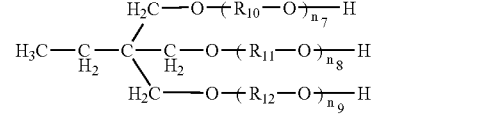

-continued

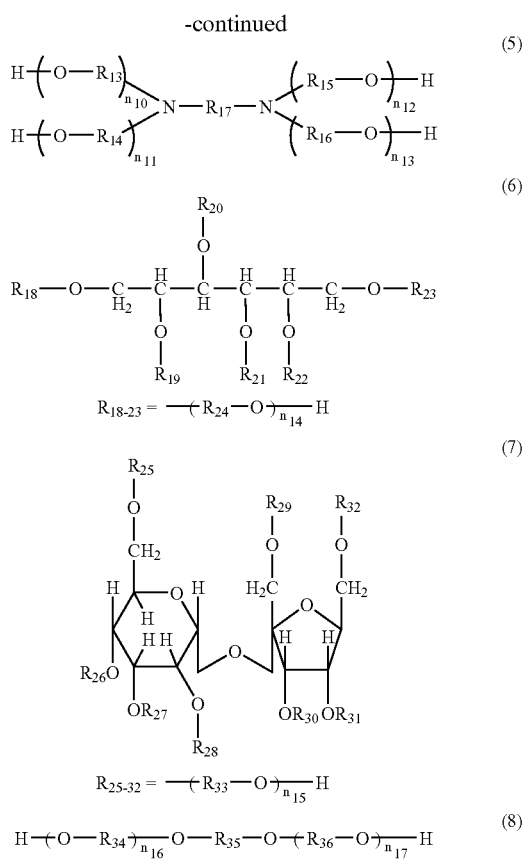

Examples of the polyurethane derivative may include the compound represented by the following formula (9):

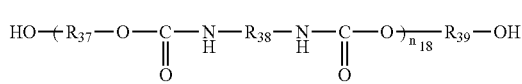

In the formulae (1) to (9), $R_1$, $R_4$ and $R_5$ are a hydrogen atom or an alkyl group, $R_{17}$, $R_{35}$ are $C_mH_{2m}$ (wherein m is an integer of 1 or more, and H may be substituted), $R_2$, $R_3$, $R_6$ to $R_{16}$, $R_{24}$, $R_{33}$, $R_{34}$, $R_{36}$, $R_{37}$, $R_{38}$ and $R_{39}$ are $C_pH_{2p}$ (wherein p is an integer of 3 or more, and H may be substituted), and $n_1$ to $n_{18}$ are integers of 1 or more.

Upon constituting the binder for the photosensitive resin layer of the present invention with a variety of the aforementioned binder materials, the binder materials may be used either singly or as a blend of two kinds or more.

The photothermal conversion agent is not particularly limited as long as it is able to convert energy of light into thermal energy. Various pigments, dyes, coloring agents, and mixture of thereof may suitably be chosen as the agent. Examples of the photothermal conversion agent may include poly(substituted)phthalocyanine compounds, cyanine days, squarylium dyes, chalcogenopyryloarylidene dyes, bis(chalcogenopyrylo)polymethine dyes, oxyindolizine dyes, bis(aminoaryl) polymethine dyes, merocyanine dyes, croconium dyes, metal thiolate dyes, and quinoid dyes. Further, publicly known color pigments that are disclosed in "Shikizai Kougaku Handbook (Handbook of color material engineering)" edited by Japan Society of Color Material and published by Asakura Shoten, "Koukinousei Shikisoto Sono Ouyou (Highly functional pigments and the application)", an additional volume Chemical Industry 30-20, p. 51-65, published by K.K. Kagaku Kogyosha, or Japanese Patent Laid-open No. H11-277927 may also be used.

The sensitizer to be added may be rhodamine compounds and coumarin compounds. Particularly, rhodamine 6G (that is, a chloride or perchloride compound of o-(6-ethylamino-3-ethylimino-2,7-dimethyl-3H-xanthen-9-yl)benzoic acid ethyl ester) can improve sensitivity when YAG-SHG laser was employed as an exposure light source. When an argon laser is employed as the exposure light source, employment of coumarin 6 (that is, 3-(2-benzothiazolyl)-7-N,N-diethylaminocoumarin) can improve sensitivity.

The amount of the additives may be in the range from 0.1 part to 20 parts by weight, or preferably, from 2.5 parts to 10 parts by weight per 100 parts by weight of the binder having the film forming ability. When the content is less than 0.1 parts by weight, desirable ultraviolet shielding ability may not be obtained. When the content is more than 20 parts by weight, flexibility and compatibility of the mask layer may be decreased, thus not being preferable. The photothermal conversion agent may be used either singly or as a blend of two kinds or more.

As the acid generator, any of known acid generators that decompose upon receiving heat or light to generate acid may be used. Example thereof may include the acid generator disclosed in Japanese Patent Application Laid-open No. 2001-260551 whose applicant is the same as the present application. In this publication, a variety of the acid generators are disclosed, all of which may be used as the acid generator according to the present invention. The publication discloses onium sulfonate as an example of an effective acid generator.

As the acid generator, generally known acid generators such as well-known triazine type or oxime sulfonate type acid generators may also be used without limitation.

Examples of the oxime sulfonate type acid generator may include α-(methylsulfonyloxyimino)-phenylacetonitrile, α-(methylsulformyloxyimino)-4-methoxyphenylacetonitrile, α-(trifluoromethylsulfonyloxyimino)-phenylacetonitrile, α-(trifluoromethylsulfonyloxyimino)-4-methoxyphenylacetonitrile, α-(ethylsulfonyloxyimino)-4-methoxyphenylacetonitrile, α-(propylsulfonyloxyimino)-4-methoxyphenylacetonitrile, and α-(methylsulfonyloxyimino)-4-bromophenylacetonitrile.

Examples of the triazine type acid generator may include triazine compounds such as 2,4-bis(trichloromethyl)-6-[2-(2-furyl)ethenyl]-s-triazine, 2,4-bis(trichloromethyl)-6-[2-(5-methyl-2-furyl)ethenyl]-s-triazine, 2,4-bis(trichloromethyl)-6-[2-(5-ethyl-2-furyl)ethenyl]-s-triazine, 2,4-bis(trichloromethyl)-6-[2-(5-propyl-2-furyl)ethenyl]-s-triazine, 2,4-bis(trichloromethyl)-6-[2-(3,5-dimethoxyphenyl)ethenyl]-s-triazine, 2,4-bis(trichloromethyl)-6-[2-(3,5-diethoxyphenyl)ethenyl]-s-triazine, 2,4-bis(trichloromethyl)-6-[2-(3,5-dipropoxyphenyl)ethenyl]-s-triazine, 2,4-bis(trichloromethyl)-6-[2-(3-methoxy-5-ethoxyphenyl)ethenyl]-s-triazine, 2,4-bis(trichloromethyl)-6-[2-(3-methoxy-5-propoxyphenyl)ethenyl]-s-triazine, 2,4-bis(trichloromethyl)-6-[2-(3,4-methylenedioxyphenyl)ethenyl]-s-triazine, 2,4-bis(trichloromethyl)-6-(3,4-methylenedioxyphenyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(2-bromo-4-methoxy)styrylphenyl-s-triazine, and 2,4-bis-trichloromethyl-6-(3-bromo-4-methoxy)styrylphenyl-s-triazine.

In the Examples to be discussed later, CP-77 (product name, manufactured by Asahi Denka Co., Ltd., 3-methyl-2-butynyl-tetrasulfoniumhexafluoroantimonate) and RED-Triazine (product name, manufactured by Sanwa Chemical Co., Ltd., 2-{2-(4-diethylamino-2-methylphenyl)ethenyl}-4,6-bis(trichloromethyl)-s-triazine) are used as the acid generators.

The amount of the acid generator to be contained may be in the range of 10 to 80 parts by weight, and preferably 30 to 60 parts by weight per 100 parts by weight of the binder having the film-forming ability. When the content of the acid generator is lower than 10 parts by weight, the amount of acid generation for deactivating ultraviolet absorbance may be insufficient. When the content of the acid generator is higher than 80 parts by weight, the flexibility and the compatibility of mask layer may decrease, thus not being preferable. The acid generator may be used either singly or as a blend of two kinds or more.

The ultraviolet absorber to be used as the feature of the present invention may be any kind of compound as long as its ability to absorb the ultraviolet radiation is deactivatable in response to the contact with any one or more of an acid, a base, and a radical. A suitable example of the ultraviolet absorber may include an azomethine compound. The azomethine compound is a compound having an azomethine group and, as a whole compound, absorbs the ultraviolet radiations. The azomethine compound has an ability to be decomposed to be an aldehyde and an amine when it comes in contact with any one or more of an acid, a base, and radical.

As an optional constituent of the mask layer, an acid propagating agent may be added thereto. Addition of the acid propagating agents may increase the exposure sensitivity in the exposing process in which the photothermal conversion agent converts light energy of the non-ultraviolet radiations into the thermal energy, the acid generator received the thermal energy to produce the acid which consequently causes deactivation of the ultraviolet absorbability of the ultraviolet absorber.

The mask layer may be formed by dissolving the constituents for forming the mask layer into an organic solvent in the course of preparation of the resin composition, applying the resulting solution on the photosensitive resin layer, and then evaporating the organic solvent. Examples of the organic solvents may include ethers such as dibutyl ether, isopropyl ether, dioxane, and tetra-hydrofuran; ketones such as acetone, diethyl ketone, methyl ethyl ketone, methyl isobutyl ketone, methyl propyl ketone, and cyclohexanone; esters such as ethyl acetate, n-propyl acetate, and n-butyl acetate; and aromatic hydrocarbon solvents such as benzene, toluene, and xylene. These organic solvents may be used either singly or as a mixture of two kinds or more.

The flexographic printing original plate and the letterpress printing original plate of the present invention may optionally have a cover sheet provided on the mask layer for the protection thereof. The plate may also have a cap layer provided on the surface of the mask layer. The cover sheet may be provided on the cap layer.

The cover sheet may be any of publicly known cover sheets that are used in an ordinary flexography, such as metal sheets, plastic films, paper sheets, and composite thereof. Examples thereof may specifically include polymeric films such as those produced by addition polymerization and linear condensation polymerization, transparent foams and fabrics, nonwoven fabrics such as a glass-fiber fabrics, and metals such as steel and aluminum. The film may be made of polyamides, polyesters, polyolefins, and polyvinyl chlorides. The film may preferably be a polyethylene film, a polyester film, a polypropylene film, or a laminate thereof. The cover sheet may preferably be in a form of a film, the thickness of which may be 10 to 500 μm, and preferably 20 to 200 μm.

The material of the cap layer is not particularly limited as long as it has a film forming ability and substantially transparent to the ultraviolet radiation, and may preferably be incompatible or substantially incompatible with the aforementioned mask layer. Specific examples thereof may include polyvinyl acetal and polyvinyl butyral.

Between the cover sheet and the mask layer, a separation layer may optionally be provided. Alternatively, the cap layer may be provided therebetween as discussed above. By providing the separation layer, peeling of the cover sheet before exposing the mask layer to the patterned light may be facilitated, and the roughening of the mask layer's surface by such peeling may be prevented. By providing the cap layer, the mask layer may be protected from melting upon the exposure of the mask layer.

An example of the method for producing the flexographic printing original plate and the letterpress printing original plate according to the invention will now be explained in more detail. A photosensitive resin composition is prepared by mixing the elastmeric binder, the monomer, the polymerization initiator, and other ingredients. The photosensitive resin composition is molded in a form of a hot-melt mass, which is then calendared to be in a desired thickness. Alternatively, the photosensitive resin composition may be melted, mixed, deaerated, and filtrated with an extruder, then extruded between the substrate and a temporary cover sheet, and then calendared to be a desired thickness. As another alternative, the substrate and the cover sheet may be put in a mold, and then the photosensitive resin composition is ejected between the substrate and the cover sheet. As a result of any of these methods, the photosensitive resin layer is laminated on the substrate. Subsequently, a resin composition (mask layer material) containing the binder having a film forming ability, the photothermal conversion agent, and the ultraviolet absorber whose ability to absorb the ultraviolet radiation is deactivatable in response to the contact with the acid is directly applied to the surface of the photosensitive resin layer, to form the mask layer. Alternatively, the resin composition (mask layer material) may be applied to the cover sheet to form the mask layer. After removing the temporary cover sheet from the mask layer, or without removing, the mask layer is laminated on the photosensitive resin layer, which has been laminated on the substrate, by applying heat and/or pressure. As a result of this process, the flexographic printing plate may be produced. Alternatively, the flexographic printing plate may be produced by laminating sequentially, on the cover sheet, the mask layer, the photosensitive resin layer, and the substrate.

Using the flexographic printing original plate and the letterpress printing original plate obtained in the aforementioned production method, the flexographic printing plate may be produced in accordance with the following procedures: The mask layer is irradiated with a non-ultraviolet radiation, such as a infrared laser or the aforementioned partially visible light, corresponding to a pattern to be printed, whereby the mask layer is converted into a mask image layer with the irradiated part which has become transparent. Subsequently, the photosensitive resin layer is irradiated with an ultraviolet actinic radiation via the mask image layer as the mask. The ultraviolet-unirradiated area of the photosensitive resin layer that was not irradiated with the ultraviolet actinic radiation and thus has been uncured is then removed by a developing liquid, to form a print plate image. As an example of the non-ultraviolet radiation, the infrared laser having a wavelength in a range of 750 nm to 2000 nm is preferred. Examples of such an infrared laser may include argon ion lasers, krypton ion lasers, helium-neon lasers, helium-cadmium lasers, ruby lasers, glass lasers, titanium-sapphire lasers, dye lasers, nitrogen lasers, metal vapor lasers, semiconductor lasers, and YAG lasers. Lasers that are optimal to the conditions may be selected. In particular, semiconductor lasers having a wavelength in a range of 750 nm to 880 nm and Nd-YAG lasers having a wavelength at 1060 nm are preferable. A laser beam-generating unit that generates the infrared lasers may be computer-controlled together with the driving unit so that the digital image information can be directly reflected to the flexographic printing original plate.

As an example of non-ultraviolet radiation in a visible region, a light having a wavelength in a range of 450 nm to 700 nm is preferred. As mentioned above, preferable examples thereof may include Ar laser having a wavelength peak around 488 nm, and ½ YAG laser having a wavelength peak around 532 nm.

The ultraviolet radiation for irradiation of the photosensitive resin layer in the present invention is an electromagnetic wave having a shorter wavelength than a visible light having a wavelength around the aforementioned infrared radiation, Ar laser and ½ YAG laser. The ultraviolet radiation are preferably a visible light in a shorter wavelength region than the aforementioned wavelength 488 nm of the Ar laser and an electromagnetic wave in the ultraviolet region, more preferably an electromagnetic wave having a wavelength peak in 300 to 450 nm, and further preferably an electromagnetic wave having a wavelength peak in 350 to 400 nm. Examples of the light sources that emit such an ultraviolet radiation may include high-pressure mercury lamps, ultraviolet fluorescent lamps, carbon arc lamps, and xenon lamps. The developer for use in the developing treatment may be any material as long as the uncured photosensitive resin layer can be dissolved, swollen or dispersed therein, such as organic solvents, water, and water-base and semi-water-base solutions. Selection of the developer liquids depends on the chemical nature of the resin layer to be removed. Organic solvents suitable as the developer may include aromatic and aliphatic hydrocarbon solvents and aromatic and aliphatic halogenated hydrocarbon solvents as well as a mixture of any of these solvent and a suitable alcohol. A suitable semi-water-base developer may contain water or a water-miscible organic solvent, as well as an alkaline compound. A suitable water-base developer may be water; and an aqueous solution of, e.g., esters such as heptyl acetate and 3-methoxybutyl acetate; hydrocarbons such as petroleum fractions, toluene, and decaline; chlorinated solvent such as tetrachloroethylene; amines such as monoethanolamine, diethanolamine and triethanolamine; and sodium hydroxide, potassium hydroxide, sodium carbonate or ammonia. These developer liquids may optionally be admixed with an alcohol such as propyl alcohol, butyl alcohol, and pentyl alcohol. The washout treatment may be performed in various ways, including dipping in the developer liquid, ejection of the liquid out of a nozzle, and brushing with a brush.

Upon preparing the flexographic printing plate, the flexographic printing original plate or the letterpress printing original plate may be attached to a cylindrical drum, and sequentially irradiated with the non-ultraviolet radiation and then with the ultraviolet radiation and then subjected to the development treatment, to further improve the productivity of the printing plate.

EXAMPLES

The present invention is explained below in more detail by way of examples. However, the following Examples are only for exemplifying the preferred embodiments. Therefore, it should be understood that the present invention is not to be construed as being limited to these examples. In the Examples, the optical density was measured by a spectrophotometer (Model U-2000, manufactured by Hitachi Ltd.).

Example 1

Hydroxypropyl cellulose (manufactured by Nippon Soda Co., Ltd.) as a binder was dissolved in cyclohexanone to obtain a uniform 10 wt % binder solution. Fifty grams of this binder solution was admixed with 0.5 g of an acid generator that generates an acid upon receiving heat (product name: CP-77, manufactured by Asahi Denka Co., Ltd., 3-methyl-2-butynyl-tetrasulfoniumhexafluoroantimonate). The mixture was stirred to make it uniform. The mixture was further admixed with 0.75 g of an ultraviolet absorber having an ability to lose ultraviolet absorbability in response to contact with an acid (product name: Shigenox CV-2, manufactured by Hakkol Chemical K.K.), and 0.25 g of a photothermal conversion agent (product name: NK-4432, manufactured by Nihon Kanko Shikiso K.K.), to prepare a uniform mask material solution.

The mask material solution was applied to a PET film having a thickness of 100 μm (cover sheet (D)), and dried at 80° C. for 5 minutes to form a mask layer (C) having a dry thickness of 5 μm to 8 μm. The optical density of the mask layer (C) was 2.5 to light of wavelength 370 nm (ultraviolet radiations) when measured with a spectrophotometer (Model U-2000, manufactured by Hitachi Ltd.). Thus, it was confirmed that the mask layer is opaque to ultraviolet radiations.

A photosensitive resin composition was prepared by dissolving 100 parts by weight of a styrene/butadiene copolymer having an average molecular weight of 240,000 (product name: Model D-1155, manufactured by JSR Shell Elastomer Co., Ltd.), 70 parts by weight of a liquid poly(1,2-butadiene) having an average molecular weight of 1,000 (product name: Nisso PB-1000, manufactured by Nippon Soda Co., Ltd.), 10 parts by weight of trimethylolpropane triacrylate, 3 parts by weight of methoxyphenyl acetophenone, 0.05 part by weight of 2,6-di-tert-butyl-4-hydroxy toluene, and 0.002 part by weight of a dye (product name: Oil Blue #503, manufactured by Orient Chemical Industries, Ltd.), in 0.2 part by weight of tetrahydrofuran. This photosensitive resin composition was sheeted in a thickness of 1.7 mm onto a substrate (A) consisting of polyethylene terephthalate sheet by extrusion molding through an extruder machine by using a high-viscosity pump. This process resulted in a formation of a photosensitive resin layer (B).

Subsequently, lamination was carried out with a press-bonding roller so that the photosensitive resin layer (B) faces and adhered to the mask layer (C), to obtain a multilayer photosensitive composite (a flexographic printing original plate) in which the substrate (A)—the photosensitive resin layer (B)—the mask layer (C)—and the cover sheet (D) were laminated and unified in this order.

After removing the cover sheet (D) from the resulting flexographic printing original plate, the revealed mask layer (C) was irradiated with a patterned infrared (non-ultraviolet) laser beam from a semiconductor laser of 600 mW energy output at wavelength of 830 nm with the mask pattern resolution of 100 lines/mm and energy density of 3 J/cm$^2$.

Although that energy density of the semiconductor laser, 3 J/cm$^2$, does not cause ablation of the mask layer (C), the amount of energy is sufficient for causing excitation of the photothermal conversion agent in the mask layer (C) to generate heat.

In the areas of the mask layer (C) that have been irradiated with the infrared laser beam, ablation does not take place as discussed above, however, the energy of the light thus applied excites the photothermal conversion agent so that the photothermal conversion agent produces thermal energy. The thermal energy excites the acid generator in those areas so that the acid generator produces an acid in the irradiated areas, whereby the ultraviolet absorbability of the ultraviolet absorber is deactivated. The mask layer (C) that has been subjected to the patterned irradiation with the infrared laser thus has a patterned latent image consisting of areas that have lost the ultraviolet absorbability and other areas that still keep the ultraviolet absorbability. The areas that have been irradiated with the infrared laser have thus lost the ultraviolet absorbability, and the ultraviolet radiations applied thereto may readily pass therethrough. On the contrary, the areas that have not been irradiated with the infrared laser keeps the initial ultraviolet absorbability, and the ultraviolet radiations applied thereto are absorbed and cannot pass through the areas.

The patterned irradiation of the mask layer (C) with the infrared laser thus gives a mask image layer (C') having a latent pattern image defined by the transparency to the ultraviolet radiation. The pattern formed on the mask image layer (C') may usually be an image of characters or pictures. In the present example, a character pattern was formed. The optical density of the mask image layer (C') in the region that was irradiated with the infrared laser light, i.e. the region that had lost the ultraviolet absorbability, to light of 370 nm wavelength was measured with a spectrophotometer (product name: U-2000, manufactured by Hitachi Ltd.). The optical density measured was 0.3, by which ready penetration of the ultraviolet radiations therethrough was confirmed.

The laminated composite was then subjected to backside exposure to ultraviolet radiation having a central wavelength of 370 nm and energy density of 75 mJ/cm$^2$ from the side of the substrate layer (A). Subsequently, the main exposure via the mask image layer (C') was performed at the energy density of 2500 mJ/cm$^2$ from the side of the mask image layer (C').

As a result of the main ultraviolet exposure, the photosensitive resin layer (B) was irradiated with the ultraviolet light in accordance with the pattern of the latent image in the mask image layer (C'). In the areas irradiated with the ultraviolet light, the cross-linking reaction and curing occurred. The mask image layer (C') and the photosensitive resin layer (B) in the non cross-linking areas were removed by a development treatment with an aromatic hydrocarbon-based developer (product name: FDO-S2, manufactured by Tokyo Ohka Kogyo Co., Ltd.) at 25° C. for four minutes. As a result, a relief image consisting of the cured resin was formed on the substrate layer (A) in which the photosensitive resin was cured in the configuration of the intended image of the characters.

There was no re-adhesion of the development debris or others on the resulting printing surface. After the development treatment, the plate was dried by heating at 55° C. for 50 minutes. Subsequently, the plate was post-treated with an ultraviolet fluorescent light having a central wavelength at 250 nm, and further post-exposed to an ultraviolet radiation having a central wavelength of 370 nm at an energy density of 3000 mJ/cm$^2$ to obtain a flexographic printing plate.

Printing on a coated paper was carried out with the flexographic printing plate thus prepared. As a result, a printed product with sharp character images was produced.

Example 2

A photosensitive resin composition was prepared by dissolving 100 parts by weight of a styrenelbutadiene copolymer having an average molecular weight of 240,000 (product name: Model D-1155, manufactured by JSR Shell Elastomer Co., Ltd.), 70 parts by weight of a liquid poly(1,2-butadiene) having an average molecular weight of 1,000 (product name: Nisso PB-1000, manufactured by Nippon Soda Co., Ltd.), 10 parts by weight of trimethylolpropane triacrylate, 3 parts by weight of 2,2-dimethoxy-1,2-diphenylethane-1-one (also known as benzyl methyl ketal), 0.05 part by weight of 2,6-di-tert-butyl-4-hydroxy toluene, and 0.002 part by weight of a dye (product name: Oil Blue #503, manufactured by Orient Chemical Industries, Ltd.), in 0.2 part by weight of tetrahydrofuran. This photosensitive resin composition was sheeted in a thickness of 1.7 mm onto the substrate (A) consisting of polyethylene terephthalate sheet by extrusion molding through an extruder machine by using a high-viscosity pump, for forming the photosensitive resin layer (B). The flexographic printing original plate was produced in the same manner as in Example 1 except that the photosensitive resin layer (B) was formed in the aforementioned procedure. The flexographic printing original plate thus obtained was subjected to the patterned irradiation with the infrared laser for forming the mask image layer (C'), irradiation of the photosensitive layer (B) with the ultraviolet radiation via the mask image layer (C'), and the subsequent development treatment in the same manner as in Example 1, to thereby obtain a flexographic printing plate having character images formed thereon. With the flexographic printing plate thus obtained, printing was carried out in the same manner as in Example 1. The resulting print product had sharper character images than those of Example 1.

Example 3

A flexographic printing original plate was prepared in the same manner as in Example 1 except that 0.5 g of an acid propagating agent (product name: Acpress 3, manufactured by Tokyo Zairyo Co., Ltd) was further admixed upon preparing the mask layer (C) in addition to the acid generator. The flexographic printing original plate thus obtained was subjected to the patterned irradiation with the infrared laser for forming the mask image layer (C'), irradiation of the photosensitive layer (B) with the ultraviolet radiation via the mask image layer (C'), and the subsequent development treatment in the same manner as in Example 1, to thereby obtain a flexographic printing plate having character images formed thereon. With the flexographic printing plate thus obtained, printing was performed in the same manner as in Example 1. The resulting print product had sharper character images than those of Example 1.

Example 4

A flexographic printing original plate was prepared in the same manner as in Example 3. The flexographic printing original plate was irradiated with a patterned light from an infrared (non-ultraviolet) laser beam from a semiconductor laser of 600 mW energy output at wavelength of 830 nm with the resolution of 100 lines/mm and energy density of 4 J/cm$^2$, in a pattern of characters. This energy density, 4 J/cm$^2$, was sufficient for causing ablation of the mask layer (C) as well as excitation of the photothermal conversion agent in the mask layer (C) to generate heat.

The selective ablation of the mask layer (C) was finished before whole thickness of the mask layer was ablated. As a result, a part of the mask layer of approximately 1 μm of remained in the areas that had been irradiated with the infrared laser beam. In the remaining mask layer, there was generated heat by the irradiation with the infrared laser beam, and the acid by the heat. The ultraviolet absorbability therein was deactivated by the acid.

The area that had been irradiated with the infrared laser was ablated in a depth so that most part of the layer was removed and therefore deactivated. Further, the remaining part therein was made transparent to the ultraviolet radiation. Therefore, the irradiated areas became more transparent than that of the mask layer in Examples 1 and 2 in which the mask layer was deactivate but not ablated.

In the areas that had been irradiated and ablated with the infrared laser, the remaining part of the mask layer in a form of a thin film prevented the surface of the photosensitive resin layer (B) therebeneath from roughening due to the high-power infrared laser beam. As a result, a relief pattern with flat top can be obtained.

With the mask image layer (C') this obtained as the mask, the photosensitive resin layer was irradiated with the ultraviolet radiations and subjected to the development treatment in the same manner as in Examples 1 and 2, to thereby obtain a flexographic printing plate.

With the flexographic printing plate thus obtained, printing was carrier out in the same manner as in Examples 1 and 2. The resulting print product had sharper character images than those of Example 2.

Since the ablation treatment was effected in the process of treating the mask layer (C) to produce the mask image layer (C') in this Example, a vacuuming and exhausting means was provided in order to clean up the ablation debris if it occurs on the mask image layer (C').

Example 5

A flexographic printing plate was prepared in the same manner as in Example 1 except that a polyvinyl alcohol (product name: PVA 4170, manufactured by Kuraray Co., Ltd.) was employed as a binder, that 2.5 g of CP-77 (manufactured by Asahi Denka Co., Ltd., 3-methyl-2-butynyl-tetrasulfoniumhexafluoroantimonate) was employed as the acid generator, and that 0.25 g of TX-EX-807K (manufactured by Nihon Shokubai Co., Ltd.) was employed as the photothermal conversion agent, for preparing the mask layer (C).

Printing was carried out with the flexographic printing plate thus prepared. As a result, a printed product with sharp character images was produced.

Example 6

Polyvinyl alcohol (product name: PVA 405, manufactured by Kuraray Co., Ltd.) as a binder was dissolved in pure water/IPA=2/1 to obtain a uniform 10 wt % solution. Fifty grams of this solution was admixed with 0.5 g of an acid generator (product name: SIS-001, manufactured by Sanwa Chemical Co., Ltd.). The mixture was stirred to make it uniform. The mixture was further admixed with 1.5 g of an ultraviolet absorber having an ability to lose ultraviolet-absorbing region in response to contact with an acid (product name: Shigenox CV-2W, manufactured by Hakkol Chemical K.K.), and 1.0 g of a photothermal conversion agent (product name: S 0306, manufactured by Nihon Sieber Hegner K.K.), to prepare a uniform solution.

The solution thus prepared was applied to a PET film having a thickness of 100 μm as a cover sheet (D), and dried at 80° C. for 5 minutes to form a ultraviolet shielding layer (C) having a dry thickness of 3 μm to 6 μm. The layer allows passage of the ultraviolet radiation therethrough only in the areas that have been irradiated with non-ultraviolet light. The optical density of the mask layer (C) at the wavelength of 370 nm was found to be 2.5.

100 parts by weight of a partially-saponified PVA having a saponification ratio of 73 mol % and polymerization degree of 500, 100 parts by weight of a photosensitive reaction product, 10 parts by weight of ethylene glycol, 4 parts by weight of benzoin isopropyl ether and 0.05 parts by weight of methylhydroquinone were dissolved in 200 parts by weight of hot water, to obtain a solution. The solution was spread over a polyester film having a previously-formed anti-halation layer, and dried at 40° C. for 15 hours, to form a photosensitive layer having a thickness of 0.7 mm.

The photosensitive reaction product used in the above was produced in the following manner: 0.25 parts by weight of methylhydroquinone was dissolved in 10 parts by weight of water, to which 74 parts by weight of dimethylol ether, 202 parts by weight of N-methylolacrylamide and 2 parts by weight of ammonium chloride were further added. The mixture was heated and stirred at 80° C. for 2 hours. The resulting reaction product was then poured into 1000 parts by weight of acetone. The precipitate was recovered by filtration to obtain a polymeric condensate (photosensitive reaction product).

A mixed solvent of water:methanol=1:2 (weight ratio) was applied to the surface of the photosensitive layer formed in the above procedure, to form a very thin layer of the solvent. The cover sheet (D) with the layer (C) that had been formed thereon was laminated thereon so that the layer (C) was in contact with the photosensitive surface, and the laminate was then pressed, to produce a photosensitive resin plate for letterpress printing.

After peeling the cover sheet (D) of the resulting photosensitive resin plate, it was found that the layer (C) was transferred and adhered to the photosensitive layer surface. The layer (C) was then irradiated with an infrared laser beam from a semiconductor laser of 600 mW energy output at wavelength of 830 nm with the resolution line of 100 lines/mm and irradiation energy of 3 J/cm$^2$, to selectively sublimate (ablate) the layer (C). The optical density of the sublimated area of the layer (C) was measured, and found to be 0.2. Subsequently, the main exposure of 1440 mJ/cm$^2$ via the selectively-sublimated layer (C) was performed with an ultraviolet radiation having a central wavelength at 370 nm. The printing surface was developed in a hot water at 35° C. for 2 minutes with a brushing-type washout machine. There was no re-adhesion of the development debris or others on the resulting printing surface. The plate was then dried and post-exposed with an ultraviolet radiation having a central wavelength at 370 nm at 1000 mJ/cm$^2$, to obtain a letterpress printing plate. Printing was carried out with the letterpress printing plate. As a result, a printed product with sharp character images was produced.

Example 7

As a binder for the mask material solution of the mask layer (C), hydroxypropyl cellulose (manufactured by Nippon Soda Co., Ltd.) was dissolved in cyclohexanone to obtain a uniform 10 wt % binder solution. Fifty grams of this binder solution was admixed with 0.5 g of an acid generator (product name: RED-Triazine, manufactured by Sanwa Chemical Co., Ltd.), and stirred to make it uniform. The mixture was further admixed with 0.75 g of an ultraviolet absorber having an ability to lose ultraviolet absorbability in response to contact with an acid (product name: Shigenox CV-2, manufactured by Hakkol Chemical K.K.), and 0.25 g of a sensitizer (7-diethylaminb-3-(2-benzoimidozolyl)coumarin), to prepare a uniform mask material solution. The flexographic printing original plate was produced in the same manner as in Example 1 except for employing the aforementioned solution as the mask material solution.

After removing the cover sheet (D) from the resulting flexographic printing original plate, the revealed mask layer (C) was irradiated with an Ar laser beam (non-ultraviolet) with the mask pattern resolution of 100 lines/mm and the energy density of 1 J/cm². This energy density, 1 J/cm², was sufficient for causing excitation of the photothermal conversion agent in the mask layer (C) to generate heat.

The patterned irradiation of the mask layer (C) with the Ar laser thus gives a mask image layer (C') having a latent pattern image defined by the transparency to the ultraviolet radiations. The pattern formed on the mask image layer (C') may usually be an image of characters or pictures. In the present example, a character pattern was formed. The optical density of the mask image layer (C') in the region that was irradiated with the Ar laser, i.e. the region that had lost the ultraviolet absorbability, to 370 nm (ultraviolet radiation) was measured with a spectrophotometer (product name: U-2000, manufactured by Hitachi Ltd.). The optical density measured was found to be 0.3, by which ready penetration of the ultraviolet radiations therethrough was confirmed.

The plate was then subjected to backside exposure to ultraviolet radiation having a central wavelength of 370 nm and energy density of 75 mJ/cm² from the side of the substrate layer (A). Subsequently, the main exposure was performed at the energy density of 2500 mJ/cm² from the side of the mask image layer (C').

As a result of the main exposure, the photosensitive resin layer (B) was exposed to the ultraviolet radiation in accordance with the pattern of the latent image in the mask image layer (C'), and the cross-linking reaction and curing occurred in the areas irradiated with the ultraviolet radiation. The mask image layer (C') and the photosensitive resin layer (B) in the non cross-linking areas was removed by a development treatment with an aromatic hydrocarbon-based developer (product name: FDO-S2, manufactured by Tokyo Ohka Kogyo Co., Ltd.) at 25° C. for four minutes. As a result, a relief image consisting of the cured resin was formed on the substrate layer (A) in which the photosensitive resin was cured in the configuration of the intended image of the characters.

There was no re-adhesion of the development debris or others on the resulting printing surface. After the development treatment, the plate was dried by heating at 55° C. for 50 minutes. Subsequently, the plate was post-treated with an ultraviolet fluorescent light having a central wavelength at 250 nm, and further post-exposed to an ultraviolet radiation having a central wavelength of 370 nm at an energy density of 3000 mJ/cm² to obtain a flexographic printing plate.

Printing on a coated paper was carried out with the flexographic printing plate thus prepared. As a result, a printed product with sharp character images was produced.

An oxygen permeability coefficient of the polyvinyl alcohol resin used as the binder in the present example was $9.64 \times 10^{-13}$. An oxygen permeability coefficient of the hydroxypropyl cellulose used in Example 1 was $4.11 \times 10^{-11}$. Therefore, the oxygen permeability of the mask layer (C) of Example 5 is lower than that of the mask layer (C) of Example 1. In other words, the mask layer (C) of Example 1 has relatively high oxygen permeability, which may result in somehow higher amount of oxygen existing on the surface of the photosensitive resin layer upon exposure of the photosensitive resin layer to light. Such presence of oxygen results in a tapered pattern profile with small tops of the patterns as the dots for printing after the exposure and development. The printing surface on such pattern tops (to which ink is applied) having smaller area contributes to the increased sharpness of the print product. Detailed comparison of the print products obtained in Example 1 and Example 5 revealed that higher sharpness of the print product was obtained in Example 1. Such a development pattern characteristics may be obtained by adjusting the oxygen permeability coefficient of the mask layer (C) in a range of $1 \times 10^{-12}$ to $9 \times 10^{-10}$.

Example 8

A mask material solution was prepared in the same manner as in Example 1.

An aqueous solution containing 5% polyvinyl butyral (product name: S-LEC KW-3, manufactured by Sekisui Chemical Co., Ltd.) was applied to a PET film having a thickness of 100 µm (cover sheet (D)) and dried at 100° C. for 3 minutes to form a so-called cap layer (E) having a dry thickness of 3 µm. The mask material solution obtained in the above was applied to the surface of the cap layer (E) and dried at 80° C. for 5 minutes to form a mask layer (C) having a dry thickness of 5 to 8 µm.

In the same manner as in Example 1, a photosensitive resin layer (B) was formed on a substrate layer (A) consisting of a polyethylene terephthalate sheet. Subsequently, lamination was carried out with a press roller so that the photosensitive resin layer (B) adhered to the mask layer (C), to obtain a multilayer photosensitive composite (a flexographic printing original plate) in which the substrate (A)—the photosensitive resin layer (B)—the mask layer (C)—the cap layer (E)—and the cover sheet (D) were laminated and unified in this order.

After removing the cover sheet (D) from the resulting flexographic printing original plate, the mask layer (C) was irradiated via the revealed cap layer (E) with a patterned infrared (non-ultraviolet) laser beam from a semiconductor laser of 600 mW energy output at wavelength of 830 nm with the mask pattern resolution of 100 lines/mm and energy density of 3 J/cm². As explained in Example 1, that energy density of the semiconductor laser, 3 J/cm², does not cause ablation of the mask layer (C), but the amount of energy is sufficient for causing excitation of the photothermal conversion agent in the mask layer (C) to generate heat. By receiving the patterned infrared laser irradiation, the mask layer (C) became the mask the mask image layer (C') having the latent image defined by transparency to the ultraviolet radiation.

The photosensitive resin layer (B) was then subjected to backside exposure to ultraviolet radiation having a central wavelength of 370 nm and energy density of 75 mJ/cm² from the side of the substrate layer (A). Subsequently, the photosensitive layer (B) was subjected to the main exposure via the mask image layer (C') and the cap layer (E) at the energy density of 2500 mJ/cm² from the side of the mask image layer (C').

As a result of the main exposure, the photosensitive resin layer (B) was exposed to the ultraviolet radiation in accordance with the pattern of the latent image in the mask image layer (C'). In the areas irradiated with the ultraviolet radiation, the cross-linking reaction and curing occurred. The cap layer and the mask image layer (C') as well as the photosensitive resin layer (B) in the non cross-linking areas were removed by a development treatment with an aromatic hydrocarbon-based developer (product name: FDO-S2, manufactured by Tokyo Ohka Kogyo Co., Ltd.) at 25° C. for four minutes in the same manner as in Example 1. As a result, a relief image consisting of the cured resin was formed on the substrate layer (A) in which the photosensitive resin was cured in the configuration of the intended image of the characters.

There was no re-adhesion of the development debris or others on the resulting printing surface. After the development treatment, the plate was dried by heating at 55° C. for 50 minutes. Subsequently, the plate was post-treated with an ultraviolet fluorescent light having a central wavelength at 250 nm, and further post-exposed to an ultraviolet radiation having a central wavelength of 370 nm at an energy density of 3000 mJ/cm$^2$ to obtain a flexographic printing plate.

Printing on a coated paper was carried out with the flexographic printing plate thus prepared. As a result, a printed product with sharp character images was produced.

Examples 9 to 20

Examples 9 to 20 that will be discussed below are characterized in that nitrocellulose (a cellulose derivative) was employed as a part of binder contained in the photosensitive resin layer.

Nitrocellulose (manufactured by Asahi Kasei Corporation) was dissolved in cyclohexanone to obtain a uniform 10 wt % solution. 50 g of the solution was further admixed with 6.25 g of any one of the binder materials described in Table 1 below, and stirred to be uniform. The mixture was further admixed with 0.5 g of acid generator (product name: CP-66, manufactured by Asahi Denka Co., Ltd.) and stirred to be uniform. The mixture was further admixed with 1.50 g of ultraviolet absorber having an ability to lose ultraviolet-absorbing region in response to contact with an acid (product name: Shigenox CV-2, manufactured by Hakkol Chemical K.K.), and 0.25 g of photothermal conversion agent (product name: NK-4432, manufactured by Nihon Kanko Shikiso Co., Ltd.), to prepare a uniform solution.

With each solution of Examples 9 to 20 prepared as the above, printing plates for flexography were prepared. Printing with these printing plates resulted in sharper character images than those of Example 1.

TABLE 1

| Example | Binder (product name or chemical formula) | Manufacturer | |
|---|---|---|---|
| 9 | Adeka polyether P-400 | Asahi Denka Co., Ltd. | Polypropylene oxide derivative |
| 10 | Adeka polyether BPX-11 | Asahi Denka Co., Ltd. | Polypropylene oxide derivative |
| 11 | Adeka polyether EDP-450 | Asahi Denka Co., Ltd. | Polypropylene oxide derivative |
| 12 | Adeka Carpol M-110 | Asahi Denka Co., Ltd. | Polypropylene oxide derivative |
| 13 | Adeka Carpol DL-80 | Asahi Denka Co., Ltd. | Polypropylene oxide derivative |
| 14 | Adeka Carpol GL-100 | Asahi Denka Co., Ltd. | Polypropylene oxide derivative |
| 15 | YS Polystar U | Yasuhara Chemical Co., Ltd. | Terpene phenol resin |
| 16 | HO{(CH$_2$)nO}$_{10}$H n = 6 | — | Polypropylene oxide derivative |
| 17 | HO(ROCONH)$_4$ROH R = (CH$_2$)m m = 6 | — | Polyalkyl polyurethane |
| 18 | Adeka Carpol SP-600 | Asahi Denka Co., Ltd. | Polypropylene oxide derivative |
| 19 | Adeka Carpol SC-800 | Asahi Denka Co., Ltd. | Polypropylene oxide derivative |
| 20 | Adeka Carpol T-400 | Asahi Denka Co., Ltd. | Polypropylene oxide derivative |

Comparative Example 1

50 parts by weight of polyamide binder (product name: Macromelt® 6900, manufactured by Henkel) and 100 parts by weight of carbon black were mixed in a mixer. The mixture was further admixed with n-butanol/toluene (80 wt %/20 wt %), to prepare a uniform mask material solution. A flexographic printing original plate was prepared in the same manner as in Example 1 except that the mask layer (C) was formed with the mask material solution prepared as in the above.

The flexographic printing original plate was irradiated with a patterned infrared (non-ultraviolet) laser beam from a semiconductor laser of 600 mW energy output at wavelength of 830 nm until the complete ablation of the mask layer was effected.

Printing was carried out with the flexographic printing plate thus prepared in this Comparative Example 1. As a result, it was unable to print with sharp images of characters since the debris of ablation remained on the photosensitive resin layer.

INDUSTRIAL APPLICABILITY

As explained in the above, the present invention is characterized by employment of, as a relief printing original plate, the photosensitive laminate having the substrate and at least the photosensitive resin layer that is photosensitive to the ultraviolet radiation and the mask layer laminated thereon, wherein the mask layer has both ultraviolet absorbability and non-ultraviolet absorbability, and the ultraviolet absorbability of the mask layer is deactivatable in response to receiving irradiation with the non-ultraviolet radiation such as infrared or Ar radiation.

According to the present invention having the aforementioned feature, it is possible to provide the relief printing original plate in which the mask image layer with an excellent contrast may be formed without roughening the surface of the photosensitive resin layer therebeneath, and the method for producing the relief printing plate using the relief printing original plate.

Although the present invention has been described with reference to the preferred examples, it should be understood that various modifications and variations can easily be made by those skilled in the art without departing from the spirit of the invention. Accordingly, the foregoing disclosure should be interpreted as illustrative only and is not to be interpreted in a limiting sense. The present invention is limited only by the scope of the following claims along with their full scope of equivalents.

REFERENCES

1. Japanese Patent Publication No. 2916408
2. Japanese Patent Application Laid-open No. 2003-35954
3. Japanese Patent Application Laid-open No. 2003-35955

4. Japanese Patent Application Laid-open No. H11-153865
5. Japanese Patent Application Laid-open No. H9-166875
6. Japanese Patent Application Laid-open No. 2001-324815
7. Japanese Patent Publication No. 2773981

The invention claimed is:

1. A relief printing original plate, comprising:
    a substrate;
    a photosensitive layer that is laminated on said substrate and that is photosensitive to ultraviolet radiations; and
    a mask layer that is laminated on the photosensitive layer, said mask layer having an ability to absorb both an ultraviolet radiation and infrared radiation, the ultraviolet absorbability of said mask layer being deactivatable in response to receiving said infrared radiation, wherein said mask layer comprises a binder resin, an acid generator, and an ultraviolet absorber whose ability to absorb the ultraviolet radiations is deactivatable in response to contact with an acid, and
    wherein the deactivation of the ultraviolet absorbability in response to receiving said infrared radiation takes place along with ablation of the mask layer when radiation energy of the infrared radiation is higher than a predetermined value.

2. The relief printing original plate according to claim 1, wherein said non-ultraviolet radiation is a light having a wavelength peak in a range of 450 to 700 nm.

3. The relief printing original plate according to claim 1, wherein an oxygen permeability coefficient of said mask layer is in a range of $1\times10^{-17}$ to $9\times10^{-10}$.

4. The relief printing original plate according to claim 1, wherein said binder resin comprises at least one selected from the group consisting of cellulose derivatives, polyalkylene oxide derivatives, and polyurethane derivatives.

5. The relief printing original plate according to claim 1, further comprising a cap layer on said mask layer.

6. A method for producing a relief printing plate comprising:
    providing a printing original plate having a substrate, a photosensitive resin layer having an ultraviolet sensitivity laminated thereon, and a mask layer laminated thereon, said mask layer having an ability to absorb both an ultraviolet radiation and an infrared radiation, the ultraviolet absorbability of said mask layer being deactivatable in response to receiving said infrared radiation;
    irradiating said mask layer with said infrared radiation in accordance with an image pattern for printing, to convert said mask layer into a mask image layer having an irradiated area being transparent to said ultraviolet radiation, wherein said mask layer is made from a composition containing at least a binder resin, an acid generator, and an ultraviolet absorber whose ability to absorb the ultraviolet radiations is deactivatable in response to contact with an acid;
    irradiating said photosensitive resin layer with said ultraviolet radiation via said mask image layer; and
    developing said original plate with a developing liquid to remove a part of said photosensitive resin layer in an ultraviolet unirradiated area that has not been irradiated with said ultraviolet radiation and has thus been uncured, whereby forming a resin layer having a relief pattern on said substrate, to obtain said relief printing plate and
    wherein said infrared irradiation includes controlling radiation energy of the infrared radiation to higher than a predetermined value so that the deactivation of the ultraviolet absorbability in said mask layer by said infrared irradiation takes place along with ablation of said mask layer.

7. The method according to claim 6, wherein an oxygen permeability coefficient of said mask layer is adjusted in a range of $1\times10^{-17}$ to $9\times10^{-10}$.

8. The relief printing original plate according to claim 1 wherein a part of the mask layer in infrared irradiated area is removed, and the mask layer that remains at the bottom of the infrared irradiated area loses its ultraviolet absorbability.

9. The method according to claim 6 wherein a part of the mask layer in infrared irradiated area is removed, and the mask layer that remains at the bottom of the infrared irradiated area loses its ultraviolet absorbability.

* * * * *